United States Patent [19]
Kondo et al.

[11] Patent Number: 4,968,918
[45] Date of Patent: Nov. 6, 1990

[54] APPARATUS FOR PLASMA TREATMENT

[75] Inventors: Yoshikazu Kondo, Hofu; Yukio Tsuda, Yoshiki; Toshihiro Yamamoto, Hofu, all of Japan

[73] Assignee: Kanebo, Ltd., Tokyo, Japan

[21] Appl. No.: 214,179

[22] Filed: Jul. 1, 1988

[30] Foreign Application Priority Data

| Jul. 6, 1987 | [JP] | Japan | 62-103644[U] |
| Nov. 10, 1987 | [JP] | Japan | 62-171464[U] |
| Dec. 22, 1987 | [JP] | Japan | 62-193395[U] |
| Apr. 6, 1988 | [JP] | Japan | 63-83076 |
| Apr. 6, 1988 | [JP] | Japan | 63-83077 |
| Apr. 6, 1988 | [JP] | Japan | 63-83078 |
| May 10, 1988 | [JP] | Japan | 63-111586 |
| May 10, 1988 | [JP] | Japan | 63-111587 |
| May 10, 1988 | [JP] | Japan | 63-111588 |
| May 25, 1988 | [JP] | Japan | 63-125943 |

[51] Int. Cl.$^5$ ............................................. H01J 1/88
[52] U.S. Cl. ........................... 315/111.21; 315/111.01; 315/111.11; 313/231.01; 313/231.31; 313/231.51; 313/307
[58] Field of Search ............ 313/231.01, 231.31, 313/231.51, 307; 315/111.01, 111.11, 111.21

[56] References Cited

U.S. PATENT DOCUMENTS

| 4,419,869 | 12/1983 | Sando et al. | 68/5 D |
| 4,437,324 | 3/1984 | Sando et al. | 68/5 E |
| 4,507,539 | 3/1985 | Sando et al. | 219/121 PY |
| 4,550,578 | 11/1985 | Sando et al. | 68/5 E |
| 4,551,310 | 11/1985 | Imada et al. | 422/186.05 |

FOREIGN PATENT DOCUMENTS 59-91130 5/1984 Japan.
61-271335 1/1986 Japan.

Primary Examiner—Eugene R. LaRoche
Assistant Examiner—Do Hyun Yoo
Attorney, Agent, or Firm—Flynn, Thiel, Boutell & Tanis

[57] ABSTRACT

An apparatus for plasma treatment of long continuous materials, typically sheet materials, which comprises a plasma treatment chamber, an electric power introducing member positioned in the central portion of the chamber, a plurality of antenna electrodes radially extending from the vicinity of the electric power introducing member, a plurality of grounded electrodes facing a treating surface of the antenna electrodes, the electric power introducing member being connected with the respective ends of the antenna electrodes closest thereto, and a guide means, i.e., guide rolls, for passing treating materials through gaps between the antenna and grounded electrodes. The antenna electrodes preferably have curved surfaces bulging out with respect to the direction of travel of the treating materials.

28 Claims, 14 Drawing Sheets

FIG_11
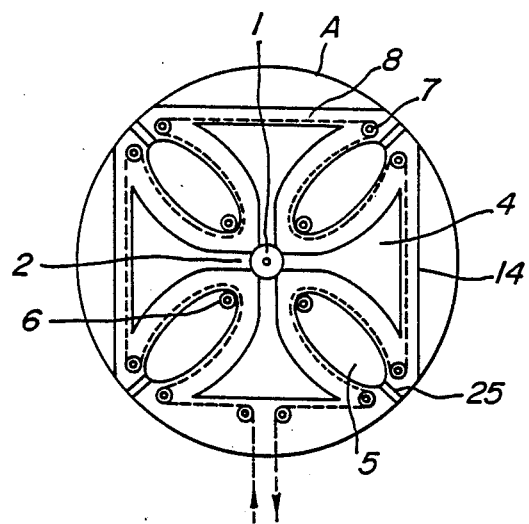
FIG_12
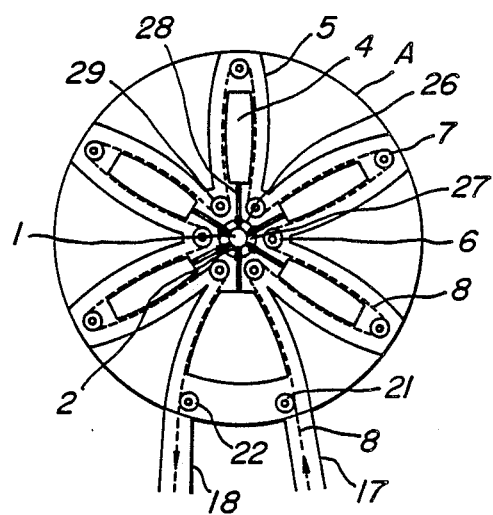

APPARATUS FOR PLASMA TREATMENT

BACKGROUND OF THE INVENTION

1. Field of the Invention

The present invention relates to an apparatus for conducting continuous plasma treatment of long materials. More particularly, this invention relates to an apparatus for conducting continuous plasma treatment of long materials, such as membranes, films, sheets, fabrics, fibers or the like, particularly, long and flat materials which are relatively small in thickness and large in width (may be referred to as "treating material", hereinafter).

2. Description of the Prior Art

As an apparatus for plasma treatment, particularly, of flat sheet-like materials or long materials, a host of proposals heretofore have been made. For example, in Japanese Patent Application Publication Nos. 11,149/1985 and 31,939/1985, apparatuses for continuous treatment of fabrics with plasma by passing and treating the fabrics between a pair of parallel electrodes having a large surface area have been proposed. Further, in Japanese Patent Application Laid-open Nos. 60-134,061 and 61-228,028, and Japanese Patent Application Publication Nos. 59,251/1985 and 36,862/1986, apparatuses for plasma treatment having a plurality of antenna electrodes arranged around a cylindrical grounded electrode have been proposed. Furthermore, in Japanese Patent Application Publication Nos. 11,150/1985 and 54,428/1985, apparatuses for plasma treatment comprising multi-layered parallel plane electrodes provided up and down alternately for forming zigzag cloth passages have been proposed.

However, the proposals made in the above Japanese Patent Application Publication Nos. 11,149/1985 and 31,939/1985 have been involved in problems, such as uneven treatment caused by local deviations in degree of treatment over the large surface area of the electrodes and decrease in treating efficiency due to generation of plasma discharges in spaces on upper and lower sides and right and left sides of electrodes, or the like. Further, in the proposals made in the above-mentioned Japanese Patent Application Laid-open No. 60-134,061 and others, the treating area of the electrodes cannot be increased so much and discharge losses around antenna electrodes have been inevitable. In the proposals made in the above Japanese Patent Application Publication Nos. 11,150/1985 and 54,428/1985, lags in phase of high frequency are produced on the respective multi-layered electrodes whereby the high frequencies mutually interfere so that difficulties have been encountered in achieving operations and qualities with stability.

Thus, none of the hitherto known apparatuses for plasma treatment can completely satisfy all of the stability of operation, uniformity of quality and treating efficiency of input power.

We, the inventors, aiming at elimination of these problems and difficulties, proposed before, as Japanese Patent Application No. 62-171,464, an apparatus for plasma treatment which comprises a vacuum vessel, a plurality of antenna electrodes arranged therein having a curved treating surface bulging out with respect to the direction of the travel of treating materials, and grounded electrodes each arranged facing a treating surface of said antenna electrodes, and is provided with a guide means for passing said treating materials through gaps between said antenna electrodes and grounded electrodes. This proposed apparatus succeeded in solving various technical problems conventional apparatuses had been involved in. However, as a result of subsequent studies, the inventors have found the necessity of further improvements from aspects of compaction of apparatuses, increase in treating efficiencies, etc. and eventually accomplished the present invention.

SUMMARY OF THE INVENTION

An object of the present invention is to provide an apparatus for plasma treatment wherein, even when a plurality of electrodes are provided, no mutual interferences of plasma are made between respective electrodes and useless and detrimental plasma discharges around the electrodes are suppressed to the utmost.

A further object is to provide an apparatus for plasma treatment which can be operated with an improved stability and ca efficiently manufacture treated materials high in grade and uniformity.

The apparatus for plasma treatment to achieve the above objects of the present invention comprises a plasma treatment chamber, a plurality of antenna electrodes arranged therein and grounded electrodes arranged facing a treating surface of said antenna electrodes, and being provided with a guide means for passing treating materials through gaps between said antenna electrodes and grounded electrodes, said apparatus being characterized in that an electric power introducing member is positioned in the central portion of said plasma treatment chamber, the antenna electrodes are arranged to radially extend from the vicinity of said electric power introducing member, and said electric power introducing member is connected with respective ends close to said electric power introducing member of said antenna electrodes.

In the first embodiment of the apparatus according to the present invention, said antenna electrodes have curved treating surfaces bulging out with respect to the direction of the travel of the treating materials.

In the second embodiment of the apparatus according to the present invention, said antenna electrodes have flat treating surfaces.

In the third embodiment of the apparatus according to the present invention, said grounded electrodes have curved treating surfaces bulging out with respect to direction of the travel of the treating materials.

In the most preferable embodiment of the present invention, said electric power introducing member is enclosed in a limited space defined by a surrounding wall and communicates with an outer atmosphere, which electric power introducing member is connected with the respective ends of the antenna electrodes close thereto through said surrounding wall defining the limited space.

The treating materials applicable to the present invention are not specifically limited insofar as they are flat and thin material with a relatively small thickness, such as membranes, films, sheets, fabrics or the like or long materials, such as fibers, threads or the like.

BRIEF DESCRIPTION OF THE DRAWINGS

The above and other objects, features and advantages of the present invention will become more apparent from reading the following description of the preferred embodiments taken in connection with the accompanying drawings, wherein:

FIGS. 10 and 11 are schematic front views showing different embodiments, respectively, of the plasma treatment chamber;

FIG. 12 is a schematic front view of a plasma treatment chamber in the most preferable embodiment of the apparatus according to the present invention;

FIGS. 21a and 21b are schematic front views showing electrode arrangements in plasma treatment apparatuses used in comparative tests, wherein FIG. 21a is the apparatus of the present invention and FIG. 21b is a conventional apparatus.

DETAILED DESCRIPTION OF THE INVENTION

Figure 1:
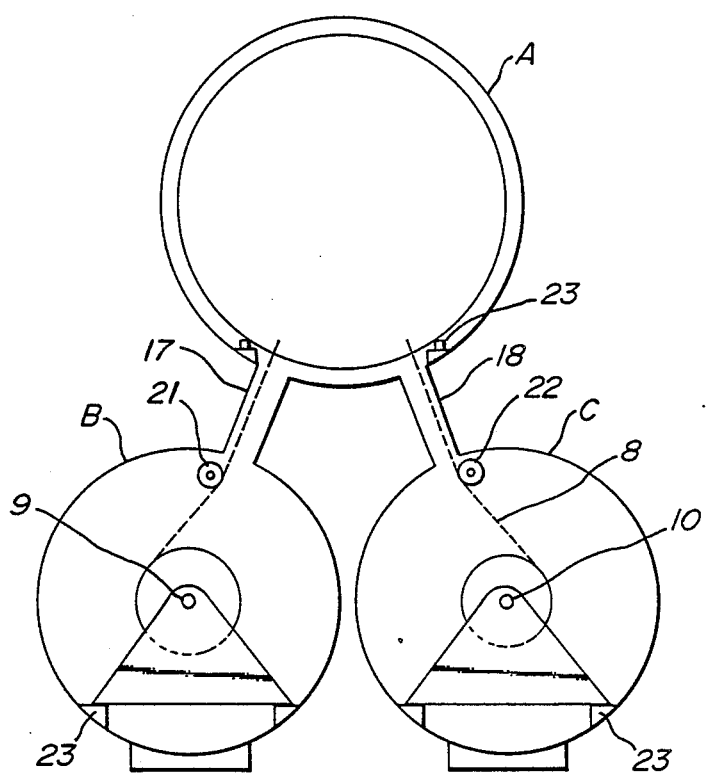
FIG. 1 is a schematic front view, partly omitted, showing an embodiment of the present invention.
Figure 2:
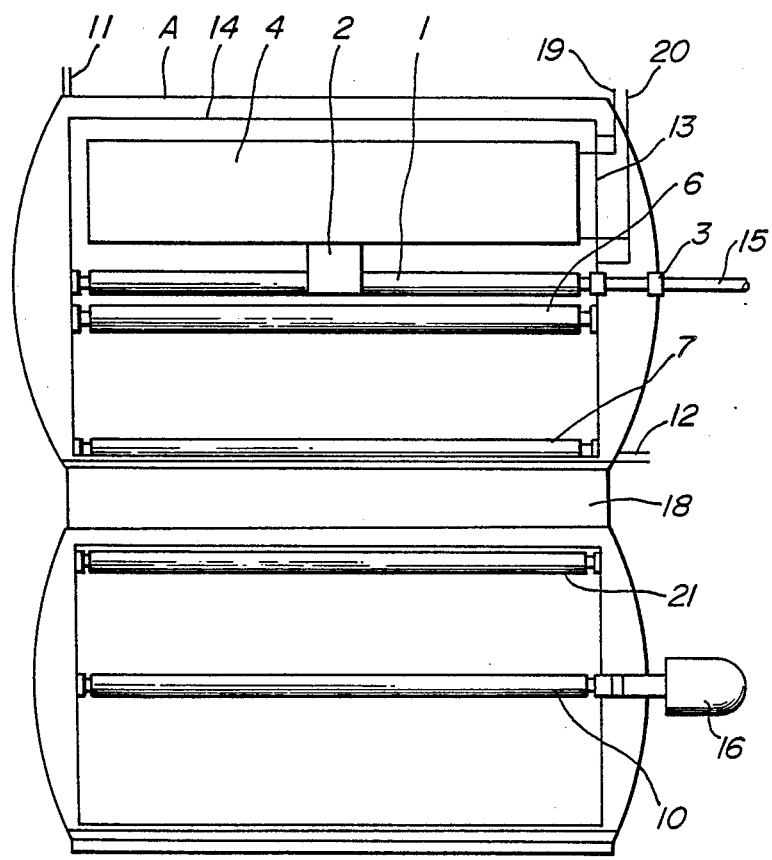
FIG. 2 is a schematic side elevational view of the same.
Figure 16:
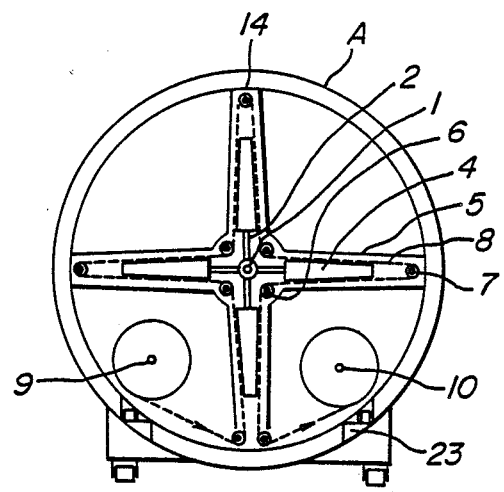
FIG. 16 is a schematic front view showing an embodiment of the present invention wherein mechanisms for feeding and winding-up the treating materials are provided in the plasma treatment chamber.

In FIGS. 1 and 2, a vacuum vessel consists of three parts: horizontal, cylindrical chambers A, B and C. The chamber A is intercommunicated with the chambers B and C by passages 17 and 18, respectively. The chamber A is a plasma treatment chamber. The chambers B and C accommodate separately a feed roll 9 and a windup roll 10 for a treating fabric 8. The chambers B and C may be united in one that accommodates both the feed roll 9 and windup roll 10. Alternatively, a simple design change will allow the chambers B and C to be omitted, placing everything in the chamber A as shown in FIG. 16.

Figure 3:
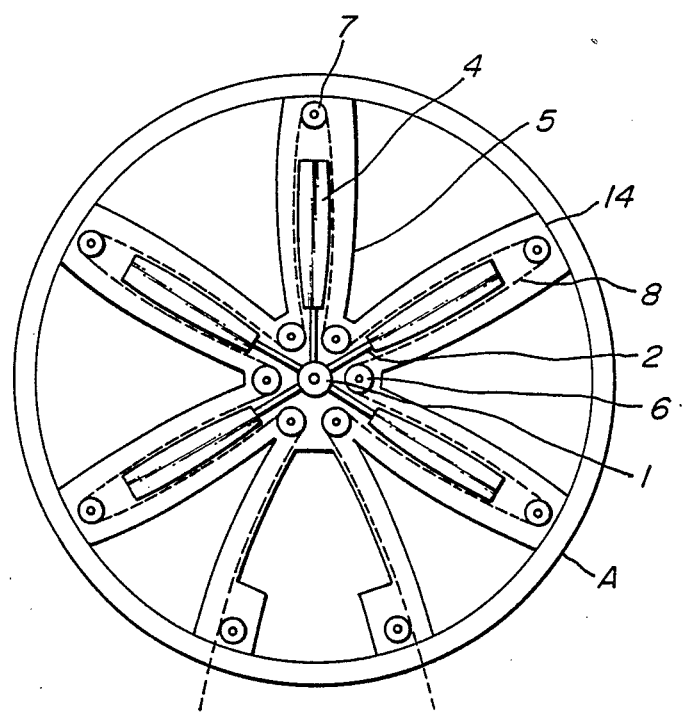
FIG. 3 is a schematic front view of a plasma treatment chamber, a principal part of the apparatus according to the present invention.

In FIG. 3 illustrating the chamber A in detail, an electric power introducing member 1 is positioned approximately in the central portion of a plurality of antenna electrodes 4. A plurality of electrode connecting members 2 extending from the electric power introducing member support the plurality of antenna electrodes 4 and electrically connect the electric power introducing member 1 with the respective antenna electrodes. The electric power introducing member 1 is electrically insulatedly supported by an insulating bearing 3 and coupled with a terminal 15 from a high frequency source. The electrode connecting member 2 and the antenna electrode 4 are not necessarily aligned with each other. However, it is preferred in view of balancing of distribution of electricity that distances from the electric power introducing member 1 to respective antenna electrodes are made equal and the smallest length possible.

All angles made by the longitudinal axes extending towards peripheral directions of any adjacent antenna electrodes do not have to be equal. However, an equiangular radial arrangement is most preferable.

Figure 4:
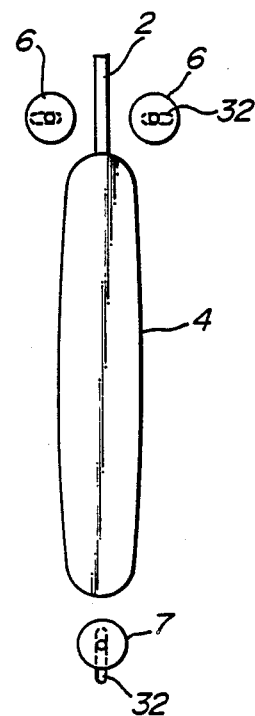
FIG. 4 is a vertical cross-sectional view showing relative arrangements of an antenna electrode preferably employed in the apparatus of the present invention and means for guiding treating materials.

As is shown in FIG. 3, in the first embodiment of the present invention, the antenna electrodes are, in order to bring the treating materials into effective and stable contact with the surfaces thereof, made to have curved surfaces bulging out with respect to the direction of the travel of the treating materials. Curvatures and shapes of the bulged surfaces should be determined adequately depending o length of the electrode, diameter of the feed or delivery guide roll, and transforming ability and operating tension of the treating material. However, the longitude of the bulged surface may be a part of an arc or partly vary in curvature so as, for example, to make the treating material contact under a uniform contact pressure with the surface of the electrode. It is enough for the ratio of the height of the middle portion to the length of the electrode to be at least 1/100, more preferably 1/50–1/10. The guide means for the treating materials, guide rolls 6 and 7, are positioned to bring the treating materials into better contact with the antenna electrode. Additionally, as shown in FIG. 4, it is preferred to provide a means 32 to adjust the positions of a plurality of guide rolls 6, 7 as well as other guide rolls so that the treating material 8 can be brought into contact making an arbitrary angle with the antenna electrode 4. The diameters of the guide rolls 6, 7, etc. are not specifically limited. By providing such a guide roll position adjusting means, for example, slots 32 such as horizontal or vertical bearing slots, lever mechanism, link mechanisms, or the like, electrodes having any curvatures or thicknesses or any distances between electrodes are made adaptable.

A grounded electrode 5 facing the antenna electrode 4 may be rod-like or plate-like. However, it is preferred to have a concave surface corresponding to the facing bulged surface of the antenna electrode, more preferably, the same curvature as that of the antenna electrode surface. Thereby plasma discharged between those electrodes can be improved in uniformity so that qualities of treated materials also can be improved in uniformity.

The grounded electrodes and antenna electrodes are arranged to extend radially from the vicinity of the central portion of the plasma treatment chamber towards the peripheral direction.

The grounded electrodes 5 and antenna electrodes 4 are preferably arranged in parallel spaced-apart relationship with each other. The spaced-apart distance depends upon treating conditions, such as input power, shape of electrodes, degree of vacuum, treating rate or the like, and purposes of treating, such as plasma etching, plasma polymerization, plasma CVD or the like. Generally, in the case where the degree of vacuum and the input energy are low, it is preferred to be small, usually 10 cm or less, preferably at most 5 cm. For example, in the case of oxygen gas plasma under a degree of vacuum of about 1 mmHg, a space distance of about 0.5-3 cm will be effective. Materials for the antenna electrode 4 and grounded electrode 5 are preferred to be highly conductive metals, such as aluminum, copper, iron, stainless steel, various metals plated therewith, or the like.

Preferable structures of such an electrode will be explained hereinafter with reference to the antenna electrode as an example.

Figure 5:
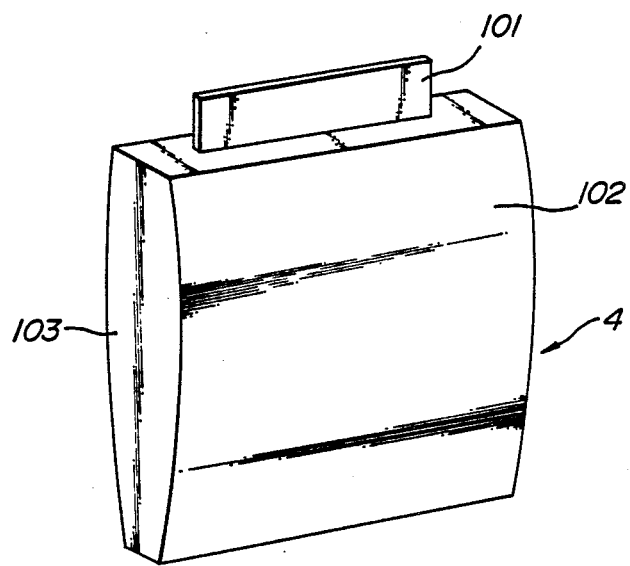
FIG. 5 is a perspective view of an antenna electrode preferably employed in the apparatus of the present invention.
Figure 6:
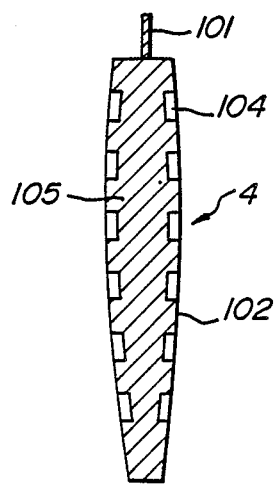
FIG. 6 is a vertical cross-sectional view parallel to the side surfaces of the antenna electrode shown in FIG. 5.

In FIGS. 5 and 6, the antenna electrode 4 has a contour consisting of surfaces of metal plate 102 and sides of side plate 103, and an electric power introducing member 101 attached to the top end thereof. Furthermore, the inside of the electrode is filled with a filling material 105 dense enough to substantially not allow the plasma to be produced inside. Hereupon, the expression, "dense enough to substantially not allow the plasma to be produced inside", should be understood to mean that the electrode is free from any such large voids or cavities as to allow useless plasma to be produced therein. The filling materials having such a degree of density include solid materials free from voids and cavities and somewhat porous materials. From the standpoint of prevention of internal plasma discharging, solid materials are preferred, while, from the standpoint of weight savings of the apparatus, porous filling materials are suitable.

The porous materials that are dense enough to substantially not allow the plasma to be produced inside may have voids or cavities, for example, when they are voids, with an average diameter of about 10 mm or less, and when long cavities, with an average diameter or width of about 5 mm or less, and further, when broad slit-like cavities, with an average space of about 4 or less, preferably, 2 mm or less.

The materials for the filling materials 105 to fill the inside of the electrode may be those not susceptible to vaporization or decomposition in vacua during plasma treatment, and employable are, for example, metals the same as or different from the electrode plates, glasses, ceramics, synthetic high-polymers, resins, rubbers and other organic or inorganic materials. As a form of the filling materials, taking the weight increase into consideration, preferably are porous materials of metals, glasses, ceramics, synthetic high-polymers, resins or rubbers, and most preferable inter alia are porous materials of ceramics, crosslinkable polymers or thermosetting resins. These materials include glasses such as hard glasses, quartz or the like, thermosetting resins such as phenolic resins, urea resins, melamine resins, polyester resins, epoxy resins or the like, thermoplastic resins such as polyethylene, polypropylene, polystyrene, polyvinyl chloride, nylon, polytetrafluoroethylene, polycarbonate or the like, rubbers such as styrene-butadiene rubber, butadiene rubber, acrylonitrile-butadiene rubber, chloroprene rubber, silicone rubber, fluororubber or the like, ceramics such as alumina, mullite, magnesia, boron nitride, asbestos, diatomite or the like, and ordinary metals.

Figure 7:
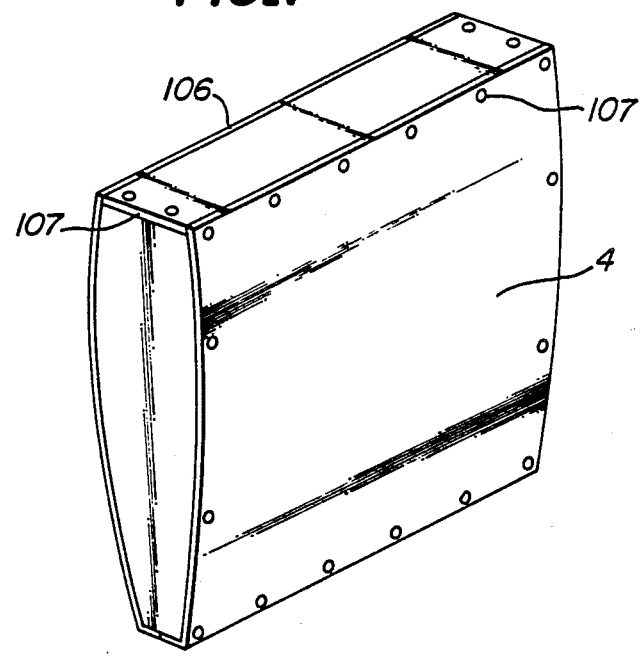
FIG. 7 is a perspective view showing a surface structure of an electrode manufactured by conventional processes.
Figure 8:
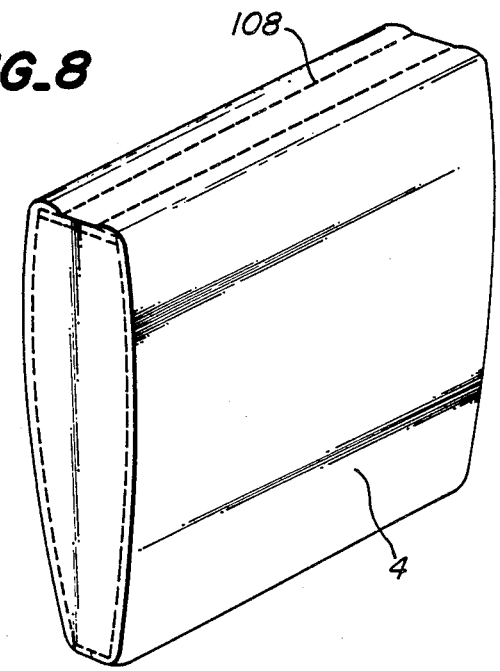
FIG. 8 is a perspective view showing a surface structure of an electrode preferably employed in the apparatus of the present invention.

As a shape of the electrode, flat plates, punched metal plates or meshes can be used. However, when the input power is 0.1 w/cm$^2$ or more, plane plates without holes or recesses or projections are preferred. Namely, in the case where the input power is augmented with the intention of increasing the plasma treatment efficiency, and antenna electrode 4 as shown in FIG. 7 which is manufactured by customarily used conventional processes generally has joints 106, clearances, or rivet or bolt heads 107 on the surfaces where abnormal plasma discharges will be produced. These abnormal plasma discharges will cause ill matchings and damage of treated materials, inducing serious defects in the case of continuous treatment. In order to eliminate such a problem and perform plasma treatments with high rate and high uniformity in treating efficiency, it is preferred, as shown in FIG. 8, that whole surface of the antenna electrode 4 is formed in a smooth, uniform and continuous monolithic structure. Such a structure has no ply-up or screw marks and is free from any portions liable to abnormal discharges, such as seams, crevices, pits, projections, or the like. One of the manufacturing processes for obtaining such a structure is monolithic molding. However, when the monolithic molding is difficult to conduct, it is preferred to utilize the monolithic molding to the utmost. Further, seams, crevices and the like 108 formed by welding during the manufacturing process are abraded to become smooth. Additionally, all edges are preferably beveled to be rounded-off. Such a structure may prevent abnormal discharges and, further, is decreased in electric resistance as compared with screwed structures so that heat generation of antenna electrodes having such structure is reduced.

As shown in FIG. 6, it is preferred that the antenna electrode 4 and the grounded electrode 5 are provided inside with passages 104 for a temperature controlling medium to effect temperature control, particularly, cooling. As the medium, any substances having fluidity can be employed. However, pure water, organic solvents or various gases or vapors for heat exchanging which are electrically insulating are preferable. Alternatively, for temperature controlling devices or cooling devices, it is preferred that a heat exchanging tube or jacket in which a coolant is circulated through passages 19 and 20 is provided on the back of a metallic plate 102. By virtue of the temperature control, the substrate temperature can be set at the most adequate temperatures corresponding to the kind of plasma treatment, such as plasma polymerization, plasma CVD, plasma etching, or the like. Thus, the antenna electrodes can be set at an aimed temperature whereby the treating fabrics are allowed to contact with the antenna electrodes, so that a stable treatment is performable for a long period of time.

Figure 9:
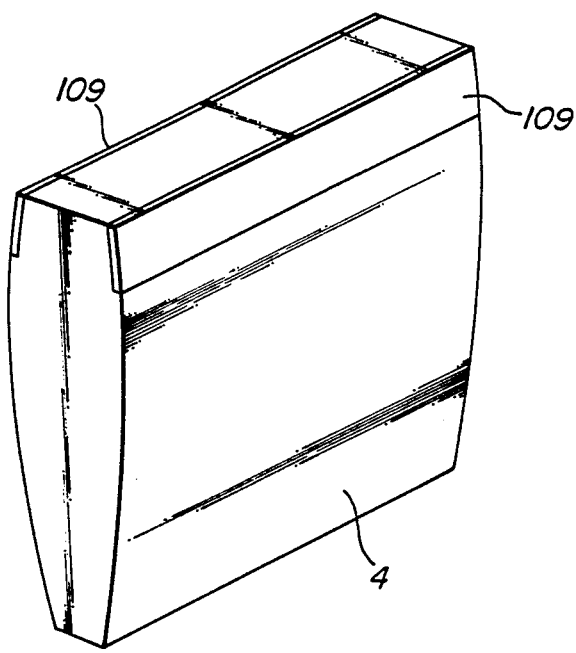
FIG. 9 is a perspective view showing an improvement of an electrode preferably employed in the apparatus of the present invention.

The electrode to be applied to the apparatus of the present invention, in order to decrease the abnormal discharges, preferably has insulating layers formed on its surfaces from the end of the electrode the treating material approaches up to the portion where the material just comes into contact with the electrode. Namely, when a long treating material is made to contact and pass on the surfaces of a stationary electrode, it is most preferable to draw the treating material from a tangential direction onto the convex surface of the electrode by adjusting guide rolls in order to avoid damage of the material due to fretting by the tip end of the electrode. However, since electric potential density increases concentratedly towards the end of the electrode, the abnormal discharges are liable to occur over the range from the end of the electrode to the portion where the material just comes into contact with the electrode, causing serial defects in the case of continuous treatment. Such an abnormal discharge will become conspicuous particularly when the plasma power is increased in order to raise the treating efficiency. Therefore, as shown in FIG. 9, insulating layers 109 are formed on the surfaces of the electrode the treating material comes into contact with, for example, preferably on the surfaces of an antenna electrode 4 including the portion where the treating material just comes into contact. Such a insulating layer 109 is preferred to be provided at least on the portion where the treating material 8 begins to contact with the electrode 4, and more preferable to be provided on the other portion where the treated material is pulled off from the electrode as well. Furthermore, it is most preferable that the insulating layers are formed on surfaces including from the end of the electrode the treating material approaches up to the portion where the material just comes into contact with the electrode and also including the delivery end of the electrode up to the portion where the treated material is pulled off.

Such an insulating layer 109 consists of a nonconductive material such as ceramics, organic or inorganic high molecular substances or the like.

Processes for forming the insulating layers include plating, coating, attaching of film or sheet, mounting of blocks, vapor depositing and the like, and are not specifically limited insofar as the object is met. The surfaces of the insulating layers are preferably made as smooth as possible to minimize damage of the treated materials. Additionally, hardness and slipperiness depend upon cleanness and treating conditions of the treating materials. For example, if the treating materials are thin films or membranes, the surfaces of the insulating layers are preferably are aventurine, easily slippable and not so hard. Employable materials for the insulating materials are, for example, inorganic materials or ceramics, such as glasses, pyrex, fused quartz, steatite, titanium oxide, barium steatite, zirconium oxide or the like, and organic high polymers, such as polystyrene, Teflon ®, polyacrylics, polyvinyl chlorides, chlorinated polyethylenes, polyimides, silicones, polyvinyl fluorides, polyethylenes, polypropylenes, polyamides, polyesters or the like.

Widths (working widths) of the insulating layers are required to be at least larger than the width of the treating materials, preferably have both side margins of at least 1 cm, more preferably at least 2 cm. The longitudinal widths, namely, lengths, are sufficient if they are long enough to suppress the abnormal discharges. If it is too long, electrode efficiency will decrease. Therefore, it is generally ¼ or less, preferably 1/6 or less, of the length of the electrode. Alternatively, a thickness of generally about 0.1 mm or more, preferably 1 mm or more, can suppress the abnormal discharged effectively. If excessive crevices or level differences are formed on the borders between insulating layers and contiguous surfaces, new abnormal discharges may be generated, so that it is preferable to be free from crevices or level differences.

Figure 10:
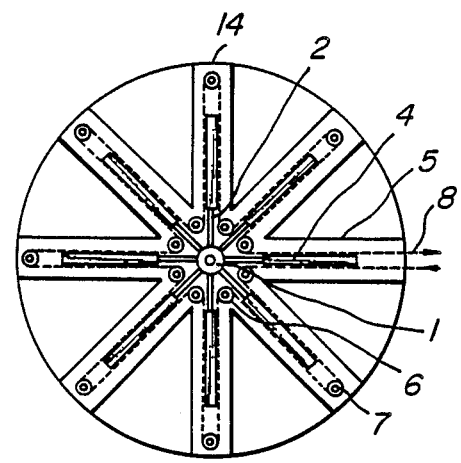

In the second embodiment of the present invention, as is shown in FIG. 10, the antenna electrodes 4 have a flat treating surfaces. Angles made by the front and back surfaces are not specifically limited and, however, they are preferably determined to easily make the travelling fabric that is guided by the guide means explained hereinafter parallel with the surface of the electrode. In the radial arrangement, all angles made by adjacent antenna electrodes may not necessarily be equal. However, an equiangular radiation is most preferable.

Further, in the third embodiment of the present invention, as is shown in FIG. 11, the grounded electrodes are, in order to bring the treating materials into effective and stable contact with the surfaces thereof, made to have curved surfaces bulging out with respect to the direction of the travel of the treating materials. Curvatures and shapes of the bulged surfaces are preferred to be determined the same as the antenna electrodes in the aforementioned first embodiment of the invention. The grounded electrodes 5 facing the antenna electrodes 4 are supported by supporting members 25 on the wall of the plasma treatment chamber or a cover 14.

Figure 13:
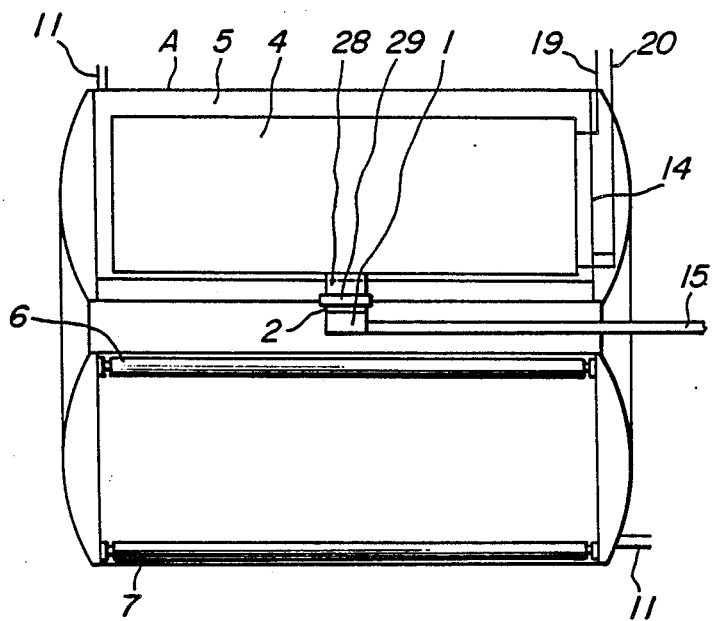
FIG. 13 is a schematic side elevational view of the plasma treatment chamber shown in FIG. 12.

In the most preferable embodiment of the present invention, the electric power introducing member is enclosed in a limited space defined by a surrounding wall and communicating with an outer atmosphere. This electric power introducing member is connected with the respective ends close thereto of the antenna electrodes through the surrounding wall defining the limited space. Namely, in FIGS. 12 and 13, the limited space 27 defined by a box or cylinder 26 is provided in approximately the center of a plurality of antenna electrodes 4. The limited space 27 communicates with the outer atmosphere at either or both of the front and the rear of the plasma treatment chamber and accommodates the electric power introducing member 1. A plurality of electrode connecting members 2 extend from the electric power introducing member through the wall of the box or cylinder 26 and support the radially arranged plural antenna electrodes 4 with their protruding ends 28. These electrode connecting members electrically connect the electric power introducing member 1 with the respective antenna electrodes and are supported hermetically on the wall of the box or cylinder 26, electrically insulated therewith by insulating materials 29. The electric power introducing member 1 is coupled with a terminal 15 from a high frequency source.

It is most preferred that the electric power introducing member 1 is positioned at the center of the limited space 27 defined by the box or cylinder 26 and all of the electrode connecting members 2 extending from the electric power introducing member 1 to the wall of the box or cylinder are in an equiangular radial arrangement. Additionally, it is most preferred as well that the protruding ends 28 extending from the wall of the box or cylinder to the respective antenna electrodes 4 are made as short as possible and are all the same length. The size and length of the above limited space 27, namely, the dimension of the box or cylinder can be designed arbitrarily in accordance with objects and form of the apparatus as well as kinds and number of pipe-lines for gases, water and the like to be installed in the plasma treatment chamber. Additionally, it is also preferred that the projecting ends 28 are covered by insulating coatings in order to prevent useless discharges. In this embodiment, also the electrode connecting member 2 and the antenna electrode 4 are not necessarily aligned with each other. However, it is preferred in view of balancing of distribution of electricity that distances from the electric power introducing member 1 to respective antenna electrodes are made equal and the smallest length possible.

Figure 14:
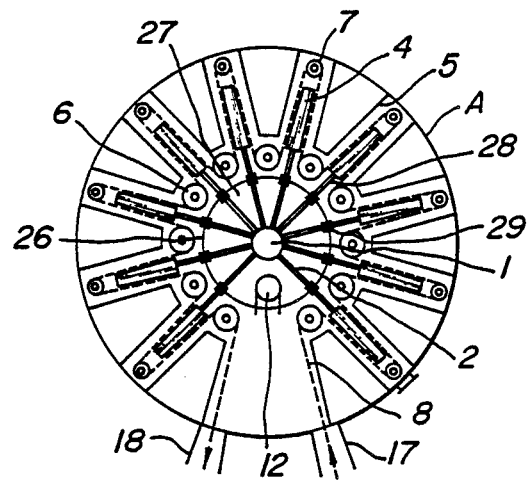
FIGS. 14 and 15 are schematic front views of plasma treatment chambers respectively in modifications of the most preferable embodiment of the apparatus according to the present invention.
Figure 15:
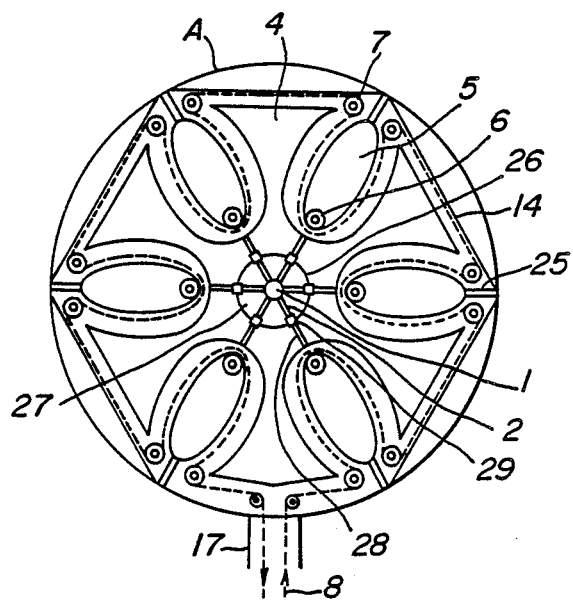

As is shown in FIG. 12, the antenna electrodes are, in order to bring the treating materials into effective and stable contact with the surfaces thereof, made to have curved surfaces bulging out with respect to the direction of the travel of the treating materials. However, as is shown in FIG. 14, the antenna electrodes 4 may have flat treating surfaces and be provided with flat surfaces grounded electrodes 5 in parallel with both sides of the antenna electrodes 4. Alternatively, as is shown in FIG. 15, the grounded electrodes may be made to have curved surfaces bulging out with respect to the direction of the travel of the treating materials to bring the treating materials into effective and stable contact with the surfaces thereof.

In FIGS. 1 and 2, the chambers B and C that communicate with the plasma treatment chamber A having the above structure accommodate a feed roll 9 and windup roll 10, separately. The windup roll 10 is driven by a motor 16 or the like. It is preferred that the rotation of the feed rolls 9 and windup roll 10 is made reversible appropriately by means of linking mechanism of the motor 16.

FIG. 16 shows an embodiment wherein the plasma treatment chamber A accommodate the feeding roll 9 and windup roll 10 so that the chambers B and C are omitted. It may be easy to design appropriately the shape and structure of the plasma treatment chamber A so that it can accommodate the feed roll 9 and windup roll 10.

Further, in the plasma treatment chamber A, there are arranged guide means embodied by, for example, guide bars, guide rolls 6 and 7 or the like mounted at appropriate positions near the bases and tops of the electrodes, to guide the treating material 8 from the feed roll 9 to the windup roll 10, successively passing through gaps between the grounded electrodes and the antenna electrodes. As the guide means, stationary rolls, idler rolls, driven rolls or combinations thereof can be appropriately employed in accordance with operating conditions, such as weight, travelling speed, tension or the like of the treating material. It is preferred that these guide means are so adjusted and arranged that the travelling treating material may contact with the surfaces of the antenna electrodes or grounded electrodes.

Materials for the rolls 6 and 7 to guide treating materials in the plasma treatment space are preferred to be, for example, metals, ceramics, metal coated ceramics, or materials coated with NBR, silicone rubbers, or the like, which are low in etching susceptibility and excellent in heat resistance as compared with the treating materials. Further, the rolls are preferably grounded. The rolls preferably have secular surfaces in order to prevent slippage of the treating materials. More preferably, they are coated with silicon rubber, NBR rubber, SBR rubber, fluororubber or the like, or covered by rubber tubes for the purpose of stable travelling and heat prevention of the treating materials.

Main structural components such as the antenna electrodes, grounded electrodes, guide means for the treating materials, electric power introducing member, and the like in the vacuum vessel are supported and integrated by a frame 13 and travel on guide rails 23 to be loaded into and unloaded from the vacuum vessel.

Figure 17:
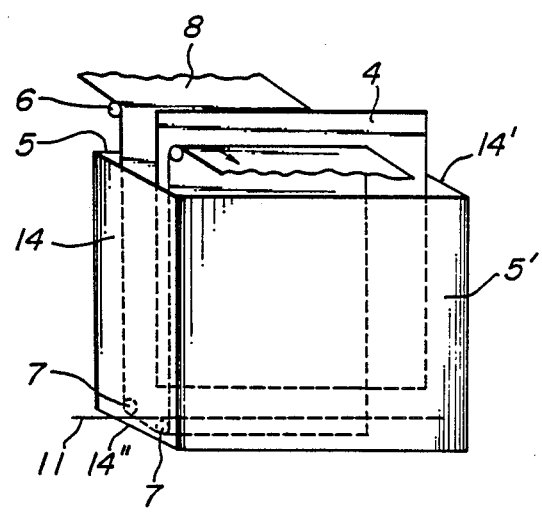
FIG. 17 is a schematic view illustrating a basic structure of a plasma treatment space defined by grounded electrodes and covers attached therebetween, which is preferably applied to the apparatus of the present invention.

In the apparatus according to the present invention, it is particularly preferred that covers extending between both side edges and outer edges, respectively, of mutually adjacent two grounded electrodes interposing an antenna electrode therebetween are provided to define a plasma treatment space and gas feed orifices and gas discharge orifices are provided near one end and the other end, respectively, of the grounded electrode in the plasma treatment space. The above covers and gas flow system serve to smoothly orient the gas flow in the plasma treatment space, introducing and directing fresh gases constantly onto surfaces of treating materials and effectively discharging decomposed gases that generate and otherwise hinder the objective treatment. FIG. 17 shows schematically a basic structural unit of the plasma treatment space defined by grounded electrodes and covers extending therebetween. In FIG. 17, a plasma treatment space is defined along treating faces of an antenna electrode 4 by covers 14, 14' extending between both side edges of mutually adjacent grounded electrodes 5, 5' interposing the antenna electrode 4 and by a cover 14" extending between the outer edges of the grounded electrodes 5, 5'. In the plasma treatment space, a gas feed pipe 11 is provided in the vicinity of one end of the grounded electrode, preferably, the outer end with respect to the aforementioned radial arrangement (the free end side of the antenna electrode). The covers 14, 14', 14" confine and regulate the gas flow between the grounded electrodes.

Materials for the cover may be either insulating or conducting and preferably are the same as that of the electrodes, for example, stainless steel, aluminum, copper plates, or the like.

The cover is preferably grounded. The distance between the covers and the antenna electrode is preferred to be larger than the distance between the grounded electrodes and the antenna electrode in view of stability and uniformity of plasma.

It is preferred that the shape of the openings of gas feed orifices 11 is a long slot or a number of small holes and, further, the orifices exist over the whole width of the electrodes, for unevenness in ratio of feed gases to decomposed gases can be obviated, resulting in a stable treating performance. As a material for the gas feed pipelines, organic materials such as plastics or the like are employable and, however, in order to use stably for a long period of time, preferable are metals high in chemical stability, plasma resistance and high temperature resistance, such as stainless steel pipes, steel pipes, aluminum pipes, glass pipes or the like.

Figure 18:
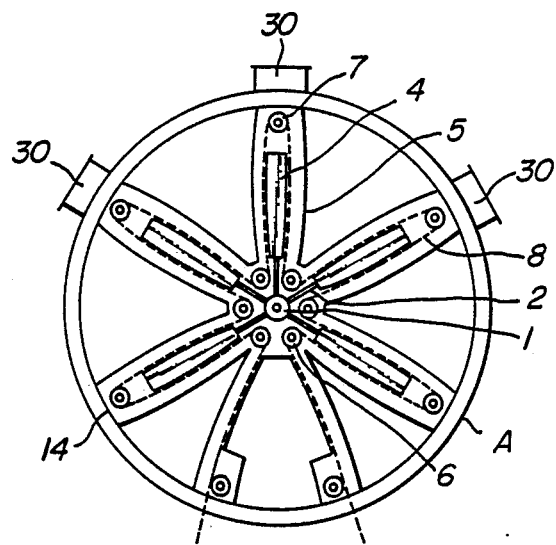
FIG. 18 is a schematic front view of a plasma treatment chamber provided with viewing ports.
Figure 19:
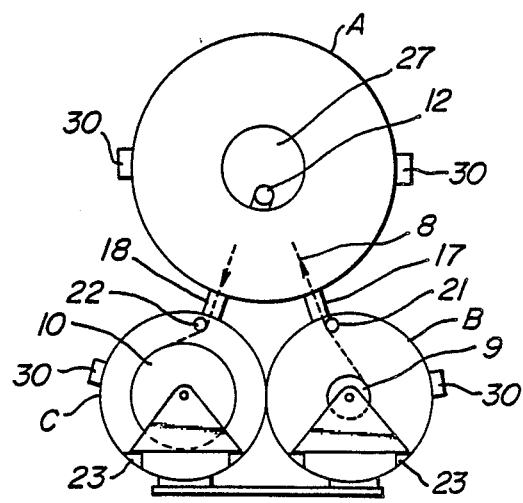
FIGS. 19 and 20 are schematic front and side elevational views, respectively, of an apparatus of the present invention which is further provided with closable and openable holes.
Figure 20:
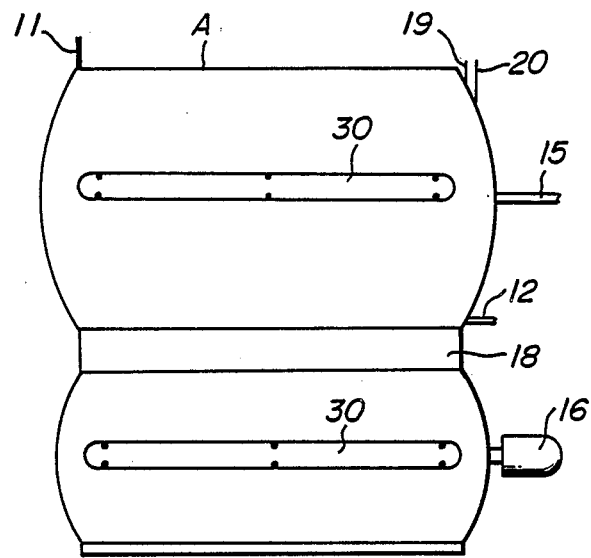

The apparatus according to the present invention is preferably provided on the periphery of the plasma electrode can be observed and, more preferably, further provided on the peripheries of chambers with at least one hole equipped with a closable and openable lid. In FIGS. 18–20, at least one viewing port and/or hole 30, in case of a hole, having an openable and closable lid is provided on chambers A, B and/or C. For the window pane of the viewing port to observe plasma discharging and treating material travelling conditions, transparent materials, such as glasses, tempered glasses, transparent ceramics, plastics or the like, are employable. However, materials having an ultraviolet-screening action are preferable.

By the observation through the viewing port with naked eyes or with the aid of instruments, accuracy, uniformity and stability of treatment as well as defects are checked. Thus, voluminous information can be caught on real time which not only is useful to much improve the stability and uniformity of treatment but also enlightens defects due to abnormal discharges, abnormal travelling of treating materials, etc. in advance of the final inspection.

Alternatively, the openable and closable holes enable the treating or treated materials to be drawn therethrough out of the chambers to be cut and connected by a sewing-machine so that batch exchange operations can be performed as all structural components, such as electrodes, guide rolls, feed rolls, windup rolls, and the like, are in a set condition in the vacuum vessel.

In the embodiment shown in FIGS. 1-3 of the apparatus of the present invention, a fabric, the treating material, in the chamber B fed from the feed roll 9, being regulated by the guide roll 21, passes through the passage 17, travels between the electrodes, and then being guided by the guide roll 22, is wound up on the windup roll 10.

In the present invention, the treating material 8 is preferably placed within a plasma sheath formed in the vicinity of the antenna electrode, more preferably within 5 mm from the antenna electrode, most preferably in contact with the antenna electrode. In conventional processes, since the treating material is arranged on the grounded electrode or between the antenna electrode and grounded electrode, spacing from both electrodes, treating rate and effect are low, so that a large scale treating apparatus has been required in order to increase the effect to a certain extent. Further, in the present invention, when the antenna electrodes have bulging treating surfaces with respect to the direction of the travel of treating materials, a contact effect of the treating materials with the antenna electrodes is remarkably high. Therefore, highly uniform treatments for a short period of time are enabled with a small input.

Though the reason why placing the treating materials within a plasma sheath, preferably contacting with the antenna electrode, produces a good effect, has not been elucidated yet, it is conjectured that a negative self-bias produced in the antenna electrode accelerates positive charged particles in the plasma.

Introduction of electric power is performed concentratedly through the electric power introducing member 1. To each antenna electrode 4, the electric power is introduced from the electric power introducing member 1 via the electrode connecting member 2. Since the apparatus has only one electric power introducing member, a singular electric source can be employed to thereby obviate most mutual interferences of high frequencies as well as plasma imbalances due to lags in frequency of oscillation, etc. between electric sources that are produced in the case where a plurality of electric sources are used.

An electric power such as a commercial frequency of 50 Hz for generating plasma, a low frequency of kilohertzes or a high frequency of megahertzes to gigahertzes, is introduced to the antenna electrodes 4 to generate low-temperature gas plasma between the antenna electrodes and grounded electrodes.

For stable generation of the low-temperature gas plasma, a low frequency or high frequency is preferred, while a high frequency of 13.56 MHz is particularly preferable in respect of efficiency and cost of treatment. Additionally, input energy of the low frequency or high frequency depends on shapes of electrodes, distances between electrodes, degrees of vacuum, treating rates, etc. and, however, usually at least 0.01 W/cm$^2$, preferably 0.05-10 W/cm$^2$, more preferably 0.1-1 W/cm$^2$.

As a gas for generating low-temperature gas plasma, non-polymerizable gases, such as oxygen, nitrogen, argon, helium, hydrogen or the like gas, or polymerizable organic monomer gases, such as methane, ethane, propane, butane, benzene, acrylic acid, styrene, or the like, can be employed. These are selected in accordance with the objects.

The plasma etching of polyester fibers, etc., oxygen, air, nitrogen, argon, hydrogen, carbonic acid gas, helium and halogenated hydrocarbons such as $CF_4$, $CF_2Cl_2$, $CFCl_3$, $CHF_3$ and the like can be used alone or in combinations thereof.

The degree of vacuum of the plasma treatment space is adjusted to fall in a range where low-temperature gas plasma is stably generated, namely, usually 0.01-10 mmHg, preferably 0.1-5 mmHg, more preferably 0.2-1 mmHg. The degree of vacuum can be adjusted by the gas or monomer gas feed rate as well as the gas discharge rate. However, the adjustment by the gas feed rate is more preferred in order to perform the objective treatment satisfactorily.

The gas feeding is conducted preferably by blowing gases onto the treating surfaces of the treating material. Thereby the treating surfaces of the treating material contact constantly with the feed fresh gases and, further, decomposed gases produced by plasma treatment are efficiently discharged from the plasma treatment space. The ratio of feed gas to decomposed gas is at least 1, preferably at least 2, more preferably at least 4. Increase of efficiency and prevention of extraneous reactions are largely influenced by how to generate plasma efficiently from the feed gases to apply to surfaces of the treating material and how to remove the decomposed gases from the surfaces of the treating material and discharge efficiently. The covers 14 extend between adjacent grounded electrodes and serve to efficiently replace the decomposed gases with the feed gases.

Conspicuous functions and effects of the present invention will be demonstrated hereinafter by way of example wherein the apparatus of the invention is applied.

EXAMPLE 1

A georgette fabric composed of a 60d/48f polyester filament warp yarn having an S twist of 250 T/M and two kinds of 75d/72f polyester filament weft yarns having S- and Z-twists of 3000 T/M, respectively, was crimpled in a washer according to a conventional process and then heat-set by drying at 180° C. The fabric was further scoured with 20% caustic soda aqueous solution at 90° C. to reduce the weight of the fabric by 20%. The resulting fabric was dyed with 15% o.w.f. of Kayalon Polyester Black GSF (trade name of dyestuff manufactured by Nippon Kayaku Co., Ltd.) and then subjected to a reduction washing to provide a black dyed georgette crepe fabric.

Figure 21A:
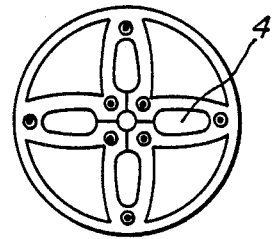

Then, an aqueous dispersion liquid of a mixture of amino modified silicone resin and partially fluorinated acrylic resin with a mixing ratio of 1:1 which had good mutual miscibility and mutual incompatibility, showing micro-phase separation, was applied onto the above fabric in an amount as resin of 1% o.w.f. by soaking according to a conventional process. After drying, the fabric was heat-treated at 150° C. to fix the resins. Then, using plasma treatment apparatuses provided with electrodes having a shape and arrangement respectively shown in FIGS. 21a (radial arrangement of the present invention) and 21b (parallel arrangement of a conventional apparatus), the above fabric was treated with plasma as being brought into contact with antenna electrodes, under the following conditions.

Figure 21B:
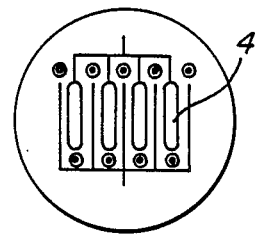

On the outset, after vacuumizing vacuum vessel to $10^{-2}$ torr by a vacuum pump, $O_2$ gas was introduced into the vacuum vessel to adjust the pressure in the vessel to 0.3 torr. Then, a high frequency power of 13.56 MHz was applied to antenna electrodes. The output of the high frequency power and treating time were varied as shown in Table 1 below. Both the electrodes 4 of the apparatuses shown in FIGS. 21a and 21b had a treating surface area of 6,000 cm².

TABLE 1

| | Conditions | | |
|---|---|---|---|
| Exp. No. | Output (W) | Treating time (min.) | L-valve |
| Untreated | — | — | 12.5 |
| a-1 | 1,500 | 1 | 9.1 |
| a-2 | " | 2 | 6.56 |
| a-3 | " | 3 | 6.32 |
| a-4 | " | 4 | 6.17 |
| a-5 | 2,000 | 1 | 8.09 |
| a-6 | " | 2 | 6.35 |
| a-7 | " | 3 | 6.09 |
| a-8 | " | 4 | 5.95 |
| b-1 | 1,500 | 1 | 12.3 |
| b-2 | " | 2 | 12.0 |
| b-3 | " | 3 | 11.7 |
| b-4 | " | 4 | 11.5 |
| b-5 | " | 10 | 10.3 |
| b-6 | 2,000 | 1 | 12.2 |
| b-7 | " | 2 | 11.8 |
| b-8 | " | 3 | 11.5 |
| b-9 | " | 4 | 11.2 |
| b-10 | " | 10 | 10.1 |

Figure 22:
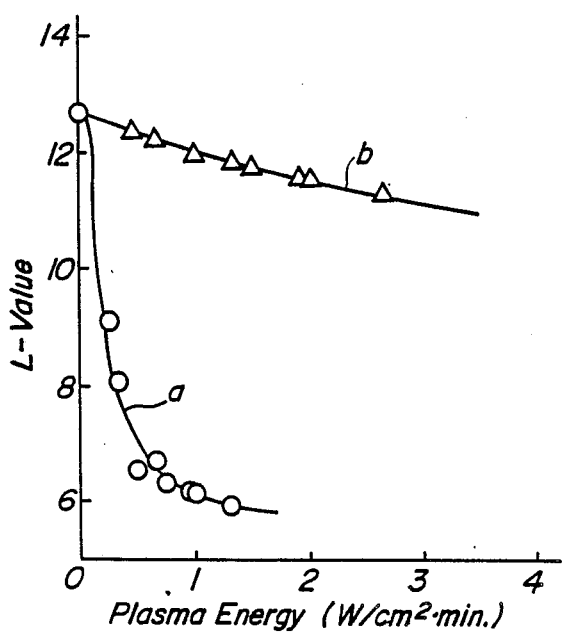
FIG. 22 is a graph showing plots of L-value versus plasma energy with respect to black dyed fabrics plasma-treated with the respective apparatuses shown in FIGS. 21a and 21b.

In the resultant fabrics, portions having a higher etching rate, namely, the partially fluorinated acrylic resin phases, were predominantly etched to form pits and recesses. In FIG. 22, an interrelation of treating time and color deepnesses (L-value) of the etched fabrics are shown. As is clear from Table 1, it has been demonstrated that the apparatus of the present invention functions remarkably better in plasma etching as compared with the conventional apparatus.

EXAMPLE 2

Onto the black dyed georgette fabric obtained in Example 1, an aqueous dispersion liquid of a mixture of amino modified silicone resin and partially fluorinated acrylic resin with a mixing ratio of 1:1 which had good mutual miscibility and mutual incompatibility, showing micro-phase separation, was applied in an amount as resin of 1% o.w.f. by soaking according to a conventional process. After drying, the fabric was heat-treated at 150° C. to fix the resins.

Then the fabric was subjected to etching treatment with low-temperature gas plasma under the following conditions.

The fabric was attached onto an antenna electrode 50 mm high, 1,200 mm long and 400 mm wide, made of aluminum plate and filled with polyester resin having closed cells of an average cell diameter of 3 mm or less. After vacuumizing the vacuum vessel to $10^{-2}$ torr, the pressure was adjusted to 0.3 torr by introducing $O_2$ gas thereinto. Then a high frequency of 13.56 MHz was applied with an output of 0.2 W per cm² of antenna electrode surface area to treat the fabric with plasma.

For the comparative purpose, the fabric was treated in the same manner except that electrodes having no filling materials inside were used.

In Table 2, weight losses by etching ($\Delta W$) and color deepnesses (L-values) of the treated fabrics when the treating time was varied are shown.

TABLE 2

| No. | Treating time (min.) | Weight loss ($\Delta w$) (%) | Color deepness (L-value) | Electrode surface temperature (°C.) |
|---|---|---|---|---|
| Experiment-9 | 2 | 0.29 | 11.5 | 30 |
| Experiment-10 | 4 | 0.61 | 9.7 | 37 |
| Experiment-11 | 6 | 0.86 | 8.0 | 46 |
| Comparative Experiment-11 | 0 | 0 | 12.8 | 22 |
| Comparative Experiment-12 | 2 | 0.27 | 12.0 | 34 |
| Comparative Experiment-13 | 4 | 0.56 | 10.5 | 45 |
| Comparative Experiment-14 | 6 | 0.79 | 8.8 | 57 |

EXAMPLES 3–8

Four minutes plasma treatment was carried out in the same manner as Example 2 above except that filling materials shown in Table 3 were used for the antenna electrodes. The result is shown in Table 3.

TABLE 3

| Example No. | Filling material | Weight loss ($\Delta w$) (%) | Color deepness (L-value) | Electrode surface temperature (°C.) |
|---|---|---|---|---|
| 3 | Porous glass | 0.60 | 9.7 | 37 |
| 4 | Phenolic resin | 0.58 | 9.8 | 38 |
| 5 | Silicone rubber | 0.62 | 9.5 | 36 |
| 6 | Aluminum | 0.60 | 9.6 | 37 |
| 7 | Porous alumina | 0.61 | 9.7 | 37 |
| 8 | Diatomite | 0.59 | 9.7 | 39 |

As demonstrated above, in the apparatus of the present invention, all the distances from the electric power introducing member to the antenna electrodes can be equalized, so that electric power of the same phase can be applied to a plurality of antenna electrodes.

Additionally, since all of the electric power introducing members for respective electrodes have been unified, singular electric source is enough. Therefore, mutual interference of plasma among a plurality of electrodes and mutual interference among a plurality of electric sources, as seen in conventional plasma treatment apparatuses having multilayered electrodes, can be prevented, resulting in stable operation and stable qualities.

Additionally, in the apparatus of the present invention, the space around the antenna electrodes is so narrow as compared with conventional apparatuses that useless plasma discharges at this portion are decreased with efficient use of input electric power. Particularly, in an apparatus comprising a plasma treatment chamber having limited space inside, the electric power can be introduced from the electric power introducing member in the limited space to the antenna electrodes through shortest paths via the electrode connecting members. Accordingly, hitherto experienced disadvantages, such as useless discharges outside an effective plasma treatment space, for example, discharges between electrode connecting members; damage of structural components or parts caused thereby; or the like; are mitigated to the utmost.

Additionally, in the case where the electrodes are partly provided with insulating surfaces are employed, the insulating surfaces formed with appropriate arrangements and dimensions well prevent abnormal plasma discharges which are otherwise caused by high electric potential concentrated towards the end edges of the electrodes when the treating material is drawn onto or pulled off from the surfaces of the electrode at a certain angle. Thus, even when the plasma input is large, defects caused by abnormal treatment and abnormal discharges, etc. will not be formed and uniform treatment can be effected. Accordingly, a large output power can be applied to thereby increase the treating rate and effect, and treated materials of uniform quality can be obtained, so that yield is largely improved.

Further, in the case where the electrodes densely filled with filling materials or having a uniform, continuous, monolithic surface are employed, useless discharges inside the antenna electrodes can be prevented to increase discharge efficiency between the antenna electrodes and the grounded electrodes and stabilize the plasma discharges. This fact functions synergetically with the increase of treating rate effectible by power increase, and brings about remarkable increases of treating efficiency.

Furthermore, the covers provided on the grounded electrodes allow fresh gases to be efficiently fed and decomposed gases to be efficiently discharged, so that the plasma treatment can be always conducted under a constant gas ratio and a bad influence of the decomposed gases can be prevented. Thus, the apparatus of the present invention is better than conventional apparatuses with respect to increases in efficiency, uniformity and stability of the plasma treatment.

As explained above, according to the present invention, apparatuses for plasma treatment as well as articles treated therewith of high quality and high stability can be provided at remarkably low cost.

What is claimed is:

1. An apparatus for plasma treatment comprising a plasma treatment chamber, an electric power introducing member positioned in the central portion of said plasma treatment chamber, a plurality of antenna electrodes arranged radially extending from the vicinity of said electric power introducing member and having their respective ends closest to said electric power introducing member connected thereto, a plurality of grounded electrodes arranged so that each faces a treating surface of said antenna electrodes, and a guide means for passing treating materials through gaps between said antenna electrodes and grounded electrodes.

2. An apparatus as claimed in claim 1, wherein said antenna electrodes have curved treating surfaces bulging out with respect to the direction of the travel of the treating materials.

3. An apparatus as claimed in claim 1, wherein said antenna electrodes have flat treating surfaces.

4. An apparatus as claimed in claim 1, wherein said grounded electrodes have curved treating surfaces bulging out with respect to the direction of the travel of the treating materials.

5. An apparatus as claimed in claim 1, wherein said electric power introducing member is enclosed in a limited space defined by a surrounding wall and communicates with an outer atmosphere, the electric power introducing member being connected with said respective ends of the antenna electrodes closest thereto through said surrounding wall defining the limited space.

6. An apparatus as claimed in claim 1, wherein said antenna electrodes have surfaces formed from metal plates and their insides filled with a filling material dense enough to substantially not allow the plasma to be produced inside the antenna electrodes.

7. An apparatus as claimed in claim 6, wherein said antenna electrodes insides are densely filled with solid materials free from voids and cavities.

8. An apparatus as claimed in claim 6, wherein said antenna electrodes insides are filled with porous materials having voids or cavities with an average diameter of about 10 mm or less.

9. An apparatus as claimed in claim 8, wherein said voids or cavities have an average diameter of about 5 mm or less.

10. An apparatus as claimed in claim 8, wherein said porous materials are selected from the group consisting of metals, glasses, ceramics, synthetic high-polymers, resins and rubbers.

11. An apparatus as claimed in claim 1, wherein at least either one group of said antenna electrodes and grounded electrodes are provided with a temperature control means.

12. An apparatus as claimed in claim 1, wherein said antenna electrodes and grounded electrodes are arranged in space parallel relationship with each other.

13. An apparatus as claimed in claim 2, wherein said guide means is arranged in a fashion so that said treating materials are brought into contact with surfaces of said antenna electrodes.

14. An apparatus as claimed in claim 3, wherein said guide means is arranged in a fashion so that said treating materials are brought into contact with surfaces of said antenna electrodes.

15. An apparatus as claimed in claim 4, wherein said guide means is arranged in a fashion so that said treating materials are brought into contact with surfaces of said grounded electrodes.

16. An apparatus as claimed in any of claims 13–15, wherein said guide means is a plurality of guide rolls adjustable in their fixed position.

17. An apparatus as claimed in claim 1, wherein covers extend between side edges and outer edges, respectively, of adjacent grounded electrodes and an antenna electrode is interposed therebetween to define a plasma treatment space between said adjacent grounded electrodes and gas feed orifices and gas discharge orifices are provided near one end and the other end, respectively, of the grounded electrodes in said plasma treating space.

18. An apparatus as claimed in claim 17, wherein said gas feed orifices are provided near the outer end with respect to the radial arrangement of the grounded electrodes.

19. An apparatus as claimed in claim 13 or 14, wherein said antenna electrodes have insulating layers formed on their surfaces from the end of the electrodes said treating materials approach up to the portion of the antenna electrodes where said treating materials just come into contact with the antenna electrodes.

20. An apparatus as claimed in claim 19, wherein said insulating layers are formed on the surfaces of the antenna electrode further including the delivery end of the antenna electrodes up to the portion of the antenna electrodes where said treating materials are pulled off from the electrodes.

21. An apparatus as claimed in claim 19, wherein said insulating layers have a length of ¼ or less of the length of said antenna electrodes.

22. An apparatus as claimed in claim 1, wherein said plasma treatment chamber further accommodates a feed roll and a windup roll for the treating materials.

23. An apparatus as claimed in claim 1, wherein said plasma treatment chamber communicates with a chamber accommodating a feed roll and a windup roll for the treating materials.

24. An apparatus as claimed in claim 1, wherein said plasma treatment chamber communicates with two chambers accommodating a feed roll and a windup roll, separately.

25. An apparatus as claimed in claim 13 or 14, wherein said antenna electrodes have a smooth, uniform and continuous monolithic surface structure.

26. An apparatus as claimed in claim 1, wherein said plasma treatment chamber is provided on its periphery with at least one viewing port through which a gap between said antenna electrode and grounded electrodes can be observed.

27. An apparatus as claimed in claim 1, wherein said plasma treatment chamber is further provided on its periphery with at least one hole equipped with a closable and openable lid.

28. An apparatus as claimed in claim 20, wherein said insulating layers have a length of ¼ or less of the length of said antenna electrodes.

* * * * *

UNITED STATES PATENT AND TRADEMARK OFFICE
CERTIFICATE OF CORRECTION

PATENT NO.   : 4,968,918
DATED        : November 6, 1990
INVENTOR(S)  : Yoshikazu KONDO et al It is certified that error appears in the above-identified patent and that said Letters Patent is hereby corrected as shown below:

Column 16, line 32; after "space" insert ---in---.

Signed and Sealed this

Fourth Day of August, 1992

Attest:

DOUGLAS B. COMER

*Attesting Officer*   Acting Commissioner of Patents and Trademarks